United States Patent [19]
Blaser

[11] 4,321,484
[45] Mar. 23, 1982

[54] FIELD EFFECT TRANSISTOR MULTIVIBRATOR

[75] Inventor: Eugene M. Blaser, Hopewell Junction, N.Y.

[73] Assignee: International Business Machines Corporation, Armonk, N.Y.

[21] Appl. No.: 16,261

[22] Filed: Feb. 28, 1979

[51] Int. Cl.³ ............................................ H03K 3/284
[52] U.S. Cl. .................................... 307/273; 307/279; 307/304
[58] Field of Search ........................ 307/273, 279, 304

[56] References Cited

U.S. PATENT DOCUMENTS

| | | | |
|---|---|---|---|
| 1,288,391 | 2/1969 | Mostyn | 112/136 |
| 3,562,559 | 2/1971 | Akrapp | 307/279 |
| 3,578,989 | 5/1971 | Heuner | 307/273 |
| 3,719,835 | 3/1973 | Eberhard | 307/273 |
| 3,996,482 | 12/1976 | Lockwood | 307/279 |
| 4,039,861 | 8/1977 | Heller et al. | 307/279 |

Primary Examiner—Harold A. Dixon
Attorney, Agent, or Firm—Theodore E. Galanthay

[57] ABSTRACT

Disclosed is a field effect transistor multivibrator for generating a controlled pulse width waveform. The generated waveform has fast rise and fall times and a pulse width linearly controlled by the capacitor in one of the cross-coupling paths. An input signal is applied to a first inverter which provides its output to a cross coupled pair of transistors. The first of the cross coupled transistors has its gate electrode coupled directly to the drain electrode of the second transistor which in turn is connected to the output terminal. The cross coupling path from the drain of the first transistor to the gate of the second cross coupled transistor includes a capacitor and a grounded gate depletion mode field effect transistor as well as an additional transistor providing a connection between the capacitor and ground potential. The second of the two cross coupled transistors has its gate and also its drain electrode connected to a fixed potential by means of respective depletion mode field effect load transistors.

8 Claims, 3 Drawing Figures

FIELD EFFECT TRANSISTOR MULTIVIBRATOR

TECHNICAL FIELD

This invention relates to a field effect transistor multivibrator circuit for generating a controlled pulse width waveform having fast rise and fall times.

A principal object of the present invention is to provide an integrated circuit multivibrator with field effect transistors.

Another object of this invention is to provide a field effect transistor multivibrator providing an output waveform having a pulse width that is linear with a selected capacitance.

Still another object of this invention is to provide a field effect transistor multivibrator which operates in response to a single terminal input.

Lastly, it is an object of this invention to provide an improved field effect transistor monostable multivibrator for generating a controlled pulse for clocking other field effect transistor circuits on the same integrated circuit chip.

BACKGROUND ART

In the prior art, a large number of multivibrator circuits are known. Multivibrators are a known means for generating controlled waveforms and are generally categorized as being monostable, bistable, or astable. Of particular interest to the field of the present invention are monostable and astable multivibrators as these types of circuits are frequently used for the purpose of generating and providing clock pulses to other circuits within an overall network. The principal difference between a monostable and an astable multivibrator is that an astable multivibrator will run continuously providing a string of pulses while a monostable multivibrator provides only a single output pulse in response to a single input or trigger pulse.

The majority of the presently known multivibrators have been implemented in bipolar transistor technology. Relatively few multivibrators have been designed with field effect transistor (FET) circuits because of the soft turn-on threshold characteristics of field effect transistors. Such soft turn-on characteristics result in unpredictable and uncontrollable pulse widths and relatively slow rise and fall times.

Since field effect transistor circuit networks may require multivibrators for clock signal generation or other functions, the presently available alternatives are to either provide clock signals generated by multivibrators external to the field effect transistor chip or to provide an on-chip field effect transistor multivibrator which provides less than adequate clock pulses. For example, see U.S. Pat. No. 3,719,835 which shows a monostable pulse generating circuit implemented entirely in field effect transistors. This patented prior art circuit is believed to have the undesired soft turn-on characteristic of field effect transistors.

BRIEF DESCRIPTION OF THE DRAWING

In the accompanying drawings forming a material part of this disclosure.

DISCLOSURE OF INVENTION

For further comprehension of my invention, and of the objects and advantages thereof, reference will be had to the following description and accompanying drawings, and to the appended claims in which the various novel features of the invention are more particularly set forth.

Figure 1:
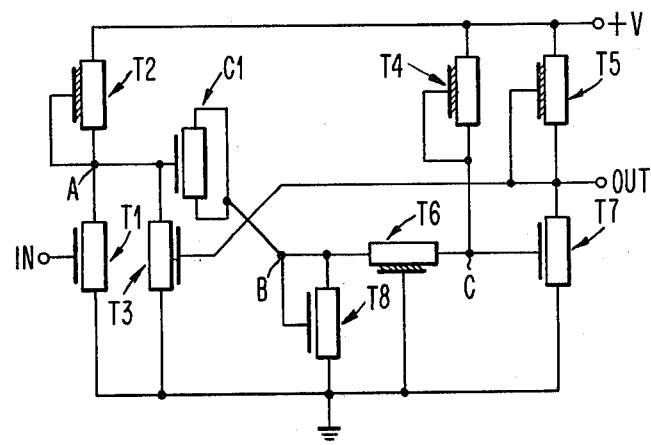
FIG. 1 is a circuit diagram depicting a preferred embodiment of my invention.

As seen in FIG. 1, there is illustrated a monostable multivibrator circuit comprising enhancement mode and depletion mode field effect transistors. The depletion mode transistors have been indicated with crosshatched gate electrode for ready distinquishability from the enhancement mode field effect transistors. Those skilled in the art will recognize that in some cases depletion and enhancement mode field effect transistors are interchangeable if suitable trade-offs are acceptable to the overall operation of a circuit. Also, all the illustrated transistors are N channel type although the present circuit could also be implemented with P channel field effect transistors.

With continued reference to FIG. 1, transistor T1 has its drain connected to node A and its source connected to a first fixed potential (ground) while its gate electrode is connected to the input terminal. Transistor T2 has its gate and source connected in common and to node A while its drain electrode is connected to the +V potential terminal. T2 is essentially a load resistor.

The first and second cross coupled transistors are illustrated by transistors T3 and T7. The drain to source path of transistor T3 is connected between node A and ground while its gate electrode is electrically coupled directly to the node of transistor T7 and the output terminal. Node A is electrically coupled to node C and the gate of transistor T7 by means of a series electrical path including capacitor C1 and transistor T6. The gate of transistor T6 is connected to ground.

The electrical connection between capacitor C1 and transistor T6 forms node B which is also connected to the drain and gate electrodes of transistor T8. The source electrode of transistor T8 is connected to ground. It is here noted that transistor T8 is a small device and forms a high resistance between node B and ground. Transistor T4 has its drain electrode connected to the +V terminal while its gate and source electrodes are connected to node C. Transistor T5 has its drain electrode connected to the +V potential while its gate and source electrodes are connected to the output node.

In short, field effect transistors T3 and T7 have their source electrodes connected in common and their drain and gate electrodes respectively cross-coupled by first and second cross coupling paths. The cross-coupling path connecting the drain of field effect transistor T3 to the gate of field effect transistor T7 includes capacitor C1 and a level shifting circuit comprising depletion mode field effect transistors T6 and T4. In a transitional state, as node B and the capacitor C1 are slowly charged through depletion mode field effect transistors T4 and T6, node C will also begin to charge slowly. However, as node B approaches the threshold voltage of grounded gate depletion mode field effect transistor T6, then field effect transistor T6 will turn off. Thus, all the current through field effect transistor T4 is then used to charge node C thereby rapidly turning on field effect transistor T7 and pulling the output node down to ground.

Figure 2:
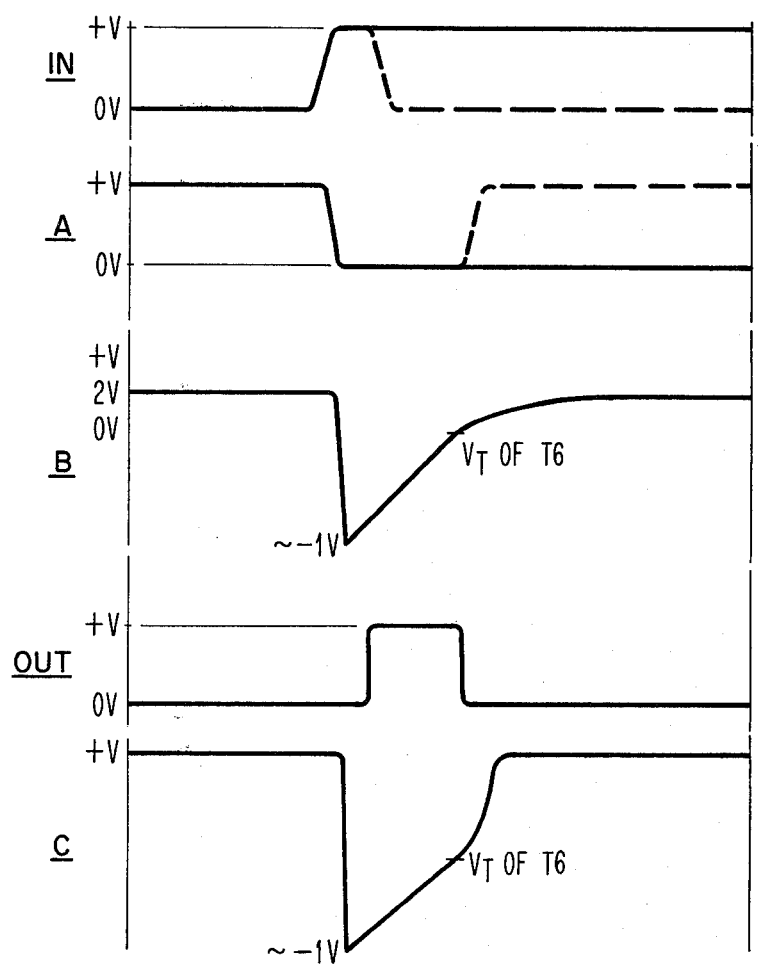
FIG. 2 is a series of waveform diagrams depicting the operation of the circuit of FIG. 1.

Refer now to FIG. 2 for a more detailed explanation of the operation of the invention. The first waveform at FIG. 2 illustrates the input signal condition. Initially as the input terminal is at a down level, transistor T1 is off and node A is charged to an up level through transistor T2. The up level (+V) will be arbitrarily selected at 5 volts to more specifically identify the various potential levels within the circuit by way of example.

Continuing with the present example, node C is charged to the up voltage level through the drain to source path of transistor T4. Thus, transistor T7 is turned on and the output terminal is brought to a down level keeping transistor T3 off—this being consistent with node A being at an up level. It should here be noted that there is a series current path from +V to ground comprising transistor T4, T6, and T8. A significant aspect of my invention is this particular circuit path in which transistor T6 is a grounded gate depletion mode device. Depletion mode devices typically have a negative threshold voltage in the vicinity of −1.5 to −2.0 volts. Thus, as node C is charged to +V, node B initially follows node C until node B reaches approximately +2.0 volts (assuming in the present example that T6 has a threshold voltage of −2 volts). Transistor T8 is a small device having a high resistance so that as long as transistors T4 and T6 are conducting current to node B, node B is maintained at 2.0 volts. The foregoing fully describes the initial conditions in the waveform diagrams.

At this point in time, consider the input trigger pulse going from ground potential to +V. With a very slight delay, transistor T1 turns on and discharges node A as illustrated by waveform A in FIG. 2. Ideally, this would cause node B to drop by 5 volts through the capacitive coupling of capacitor C1. In practice, node B will drop to approximately −1 volt when one considers the actual illustrated circuit conditions. Node B dropping to −1 volt causes transistor T6 to conduct thereby causing node C to follow node B and also drop to approximately −1 volt as illustrated in waveform C in FIG. 2. Node C dropping to −1 volt causes transistor T7 to turn off rapidly permitting the output node to rise to +V by means of current through transistor T5. This is seen in the waveform labelled "OUT" in FIG. 2. Note that the vertical dimensions of these waveforms are not to scale, but rather have been exaggerated to illustrate the particular inventive aspects of my invention.

At this point refer again to the waveform labelled "IN" in FIG. 2 and assume first the condition where the input waveform stays at an up level as indicated by the solid line. In this case, node A will fully remain at a down level as indicated by the down level of waveform A since transistor T1 will remain on maintaining node A at a down level. At this point, current through transistor T4 begins to charge node C to an up level and since transistor T6 is on, node B will closely follow node C to charge capacitor C1. As node B approaches 2 volts (the absolute value of the assumed threshold of T6), transistor T6 turns off. Transistor T4, however, will continue to provide the same large current (previously required to charge capacitor C1) to node C even after device 6 has been turned off. This causes a very rapid rise in the voltage of node C rapidly turning on transistor T7 and bringing the output terminal to a down level.

It is here worthwhile to note that in FIG. 2B the waveform rises exponentially as long as T6 is on. Essentially, capacitor C1 is charged in accordance with an RC time constant in which capacitor C1 forms the capacitance while devices T2 and T4 form the resistive component. As soon as T6 turns off (near the absolute value of the threshold voltage of T6 which was designated as approximately 2 volts), node B receives very little current and eventually reaches 2 volts only by means of leakages through transistor T6. It is noted that as soon as T6 begins to turn off, the waveform at node C suddenly takes an upward turn. Since the threshold voltage of enhancement mode device T7 is in the range of +1 volt, T7 is rapidly turned on at approximately the point in time at which T6 turns off.

This point in time at which T7 turns on is not only predictable but controllable. It has been found that the width of the output pulse is directly proportional to the size of capacitance of C1. Thus, the turning on of transistor T7 which brings the output pulse to a down level and defines the output pulse width, can be controlled by adjusting the capacitance of capacitor C1 (or the resistive component in the RC network). It has been found that varying the capacitance of capacitor C1 from 0.5 to 1.5 pico-farads varies the width of the output pulse linearly from 20 to 60 nanoseconds.

Another noted feature of the present invention is that it provides an output clock signal in response to various pulse width input signals. Moreover, only a single input signal at the input terminal at the gate of transistor T1 is required. For example, refer to the input waveform in FIG. 2 as indicated in dotted lines. Assume that the input signal drops back to ground level after the output signal has risen to an up level. At this point in time, the up level at the output terminal turns transistor T3 on and maintains node A at a down level even though the input terminal has also gone to a down level. In this alternate timing condition, however, as the output pulse terminates, transistor T3 is turned off and node A rises to +V as indicated in the corresponding waveform diagram.

Figure 3:
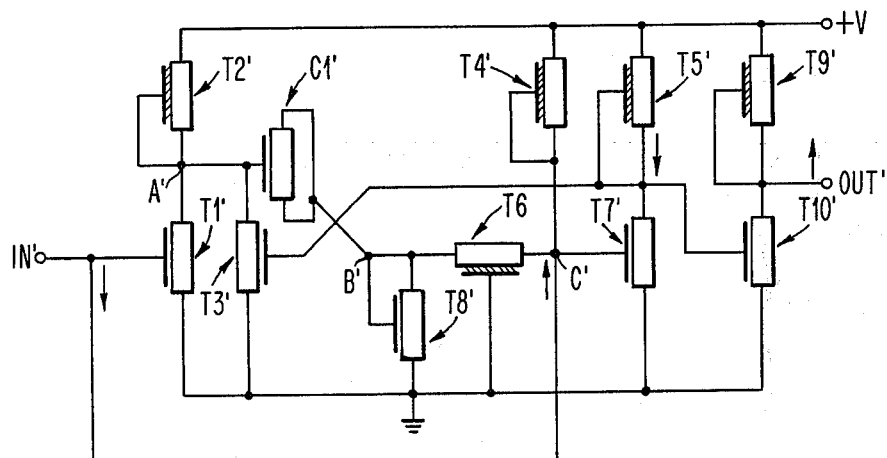
FIG. 3 is a circuit diagram depicting an alternate embodiment of my invention.
Figure 3:
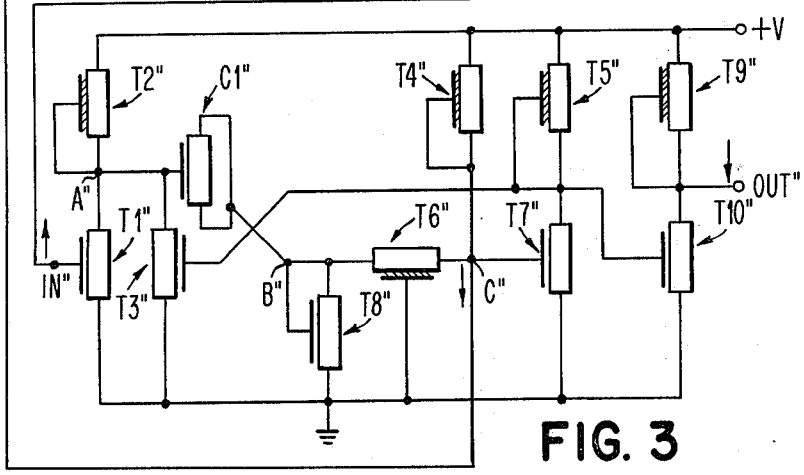

While the FIG. 1 embodiment is a monostable multivibrator, the aforementioned advantageous features of my invention are equally appropriate in an astable multivibrator. Such an astable multivibrator circuit is depicted in FIG. 3. FIG. 3 is essentially a repeat of the FIG. 1 embodiment with a mirror image of the same circuit utilized to perform the astable function. For this reason, corresponding elements and nodes have been designated with corresponding reference numerals having prime (') and double prime (") notation. Added in FIG. 3 is the buffer driver inverter circuit T9' and T10' in which the gate of T10' is connected to the output node between T5' and T7'. (This is merely a buffer driver in case one is desired.) Although the drain electrode of T9' is shown connected to the same +V terminal as the other transistors, it could be connected to a different power supply for a different up level output signal at the terminal OUT'. Also, newly added are transistors T9" and T10" forming a further buffer driver output OUT". This provides a different phase of the astable waveform if desired.

The astable feature is obtained by taking the signal at node C' and supplying it as an input at input" at the gate of transistor T1". Note that a connection from the terminal OUT' to the terminal IN" will perform substantially the same function and could be utilized alternatively when the buffer circuit comprising T9' and T10' is available. Node C" is connected to the IN' terminal at the gate of T1' to maintain the continuous output waveform characteristic of astable multivibrators. Here again, instead of node C" the terminal OUT" could be connected to the gate of T1' for a comparable result. Also, devices T3' and T3" could be deleted since the safeguard of preventing node A' or A" from being brought to a premature down level is no longer required.

Lastly, it is noted that the capacitors (C1, C1' and C1") have been designated as FET capacitors in which the gate electrode forms one plate while the drain and source junctions in common form the other plate of the capacitor. Of course any structural arrangement forming a capacitance would also satisfy the functional requirements of my invention.

While I have illustrated and described the preferred embodiments of my invention, it is to be understood that I do not limit myself to the precise constructions herein disclosed and the right is reserved to all changes and modifications coming within the scope of the invention as defined in the appended claims.

Having thus described my invention, what I claim as new, and desire to secure by Letters Patent is:

1. An improved field effect transistor multivibrator having first and second field effect transistors with their source electrodes being connected in common and their drain and gate electrodes being respectively cross-coupled by first and second cross-coupling paths, one of the cross-coupling paths comprising:
   a capacitor and a third field effect transistor connected in series between the drain electrode of said first field effect transistor and the gate electrode of said second field effect transistor, said third field effect transistor having its drain to source path connected between the gate electrode of said second field effect transistor and said capacitor, and having its gate electrode connected to a first fixed potential.

2. An improved field effect transistor multivibrator as in claim 1 further comprising:
   a fourth field effect transistor having its drain and gate electrodes connected to said capacitor, and its source electrode connected in common with the source electrodes of the first and second field effect transistors.

3. An improved field effect transistor multivibrator as in claim 1 further comprising:
   a depletion mode field effect transistor having its source and gate electrodes connected to the drain electrode of said second field effect transistor, its drain electrode being connected to a second fixed potential.

4. An improved field effect transistor multivibrator as in claim 1 further comprising:
   a fourth field effect transistor having its drain to source path connected in parallel with the drain to source path of said first field effect transistor; and the drain electrode of said fourth field effect transistor and said first field effect transistor being connected to a load device which in turn is connected to a fixed potential, an input signal being supplied at the gate electrode of said fourth field effect transistor.

5. A field effect transistor multivibrator as in claim 4 further comprising:
   an output buffer including a fifth field effect transistor having a drain electrode, a source electrode, and a gate electrode, the gate electrode of said fifth field effect transistor being connected to the drain electrode of the second field effect transistor.

6. An improved field effect transistor multivibrator having first and second field effect transistors with their source electrodes being connected in common and their drain and gate electrodes being respectively cross-coupled by first and second cross-coupling paths, one of the cross-coupling paths comprising:
   a capacitor and a circuit means connected in series between the drain electrode of said first field effect transistor and the gate electrode of said second field effect transistor;
   said circuit means including a third field effect transistor having its drain to source path connected between the gate electrode of said second field effect transistor and said capacitor, and having its gate electrode connected to a first fixed potential;
   said first and second field effect transistors being enhancement mode, said third field effect transistor being depletion mode, said gate electrode of the third field effect transistor being connected to said first fixed potential being also connected to the common connection of the source electrodes of said first and second transistors.

7. An improved field effect transistor multivibrator as in claim 6 wherein said circuit means further comprises:
   another depletion mode field effect transistor having its gate and source electrodes connected at a circuit point between said third field effect transistor and the gate electrode of said second field effect transistor and its drain electrode connected to a second fixed potential, said another depletion mode transistor and said third field effect transistor forming a charging path from said second fixed potential to said capacitor until said third field effect transistor turns off.

8. An improved field effect transistor multivibrator having first and second field effect transistors with their source electrodes being connected in common and their drain and gate electrodes being respectively cross-coupled by first and second cross-coupling paths, comprising:
   a first network comprising
      a capacitor and a circuit means connected in series between the drain electrode of said first field effect transistor and the gate electrode of said second field effect transistor;
      a third field effect transistor having its drain to source path connected in parallel with the drain to source path of said first field effect transistor;
      the drain electrode of said third field effect transistor and said first field effect transistor being connected to a load device which in turn is connected to a fixed potential, an input signal being supplied at the gate electrode of said third field effect transistor;
   a second network consisting of the same elements as said first network;
   a first conductive connection from the gate electrode of said second field effect transistor to the input terminal of the second network; and
   a second conductive connection from the input terminal of the first network to a node corresponding to the gate electrode of the second field effect transistor in the second network.

* * * * *